United States Patent
Harer et al.

(10) Patent No.: US 7,415,684 B2
(45) Date of Patent: Aug. 19, 2008

(54) FACILITATING STRUCTURAL COVERAGE OF A DESIGN DURING DESIGN VERIFICATION

(75) Inventors: Kevin M. Harer, Cornelius, OR (US); Mandar Munishwar, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 329 days.

(21) Appl. No.: 11/342,056

(22) Filed: Jan. 27, 2006

(65) Prior Publication Data

US 2007/0180414 A1 Aug. 2, 2007

(51) Int. Cl.
*G06F 17/50* (2006.01)
(52) U.S. Cl. .............................................. 716/5; 716/4
(58) Field of Classification Search .................. 716/4–5; 703/13–17; 714/32–35, 27, 38, 45–47, 724
See application file for complete search history.

(56) References Cited

U.S. PATENT DOCUMENTS 6,779,135 B1 * 8/2004 Ur et al. ........................ 714/38
7,124,383 B2 * 10/2006 Chen et al. ..................... 716/5
2003/0110474 A1 * 6/2003 Ur et al. ....................... 717/131
2006/0010428 A1 * 1/2006 Rushby et al. ............... 717/124

* cited by examiner

*Primary Examiner*—Vuthe Siek
(74) *Attorney, Agent, or Firm*—Park, Vaughan & Fleming LLP

(57) ABSTRACT

One embodiment of the present invention provides a method and a system that facilitates structural coverage of a design during a design verification process. During operation, the system receives a hardware description of the design, which contains one or more module instances and a set of structural coverage targets for a set of structures in the design. The system then extracts a control flow, the set of structural coverage targets, and a set of structural coverage metrics for the hardware description, and creates a shadow module with the same control flow as the hardware description. This shadow module contains a set of parallel structures that correspond to the set of structural coverage targets in the control flow of the hardware description and serve as targets for formal methods used to analyze the design. The system also generates a set of cross-module references to link the set of parallel structures in the shadow module with signals from the set of structures in the hardware description. The system then applies a formal verification tool to the design, including the shadow module and the cross-module references in an attempt to achieve the desired structural coverage.

18 Claims, 6 Drawing Sheets

DUT BLOCK 302

```
always @(posedge clk)
    if (x&y)
        z = a&b;
    else
        z = a|b;
```

FIG. 3A

DUT BLOCK 302

```
always @(posedge clk)
    if (x&y)
        z = a&b;
        T1 = 1;
    else
        z = a|b;
        T2 = 1;
```

TARGET T1 304
TARGET T2 306

FIG. 3B

DUT BLOCK 302

```
always @(posedge clk)
    if (x&y)
        z = a&b;
        T1 = 1;
    else
        z = a|b;
        T2 = 1;
```

CONDITION COVERAGE TARGETS 308

FACILITATING STRUCTURAL COVERAGE OF A DESIGN DURING DESIGN VERIFICATION

BACKGROUND

1. Field of the Invention

The present invention relates to the process of verifying a hardware design to ensure that it operates correctly. More specifically, the present invention relates to a method and an apparatus for facilitating structural coverage of a design during a design verification process.

2. Related Art

Verification techniques which are presently used to ensure the functional correctness of integrated circuits do not scale with the complexity of circuit designs. For instance, because of the non-linear nature of state machines, increasing the complexity of a design can lead to an exponential increase in the verification complexity. For example, each additional state element in a state machine doubles the size of the state-space to be verified. However, despite increasing verification complexity, design correctness still must be verified to ensure that designs operate correctly.

Design verification techniques attempt to determine whether a design-under-test (DUT) will operate correctly. In particular, commonly-used assertion-based verification techniques operate by sprinkling "monitoring points," or "assertions," throughout the design description in the hope of detecting violations during design simulation. While designers can build assertions and test cases to cover every aspect of the design, this manual process is extremely time-consuming.

To reduce the amount of human time involved in the verification process, many simulation tools attempt to use random input patterns to achieve a target "coverage" for a design. For instance, achieving the target coverage can involve executing a certain percentage of the statements, branch conditions, and/or execution paths in the design. Designers seek to attain "coverage convergence," or a reasonable level of certainty that an acceptable subset of the design has been tested. To minimize the cost of achieving coverage convergence, "formal tools" that incorporate mathematically-based techniques are often used to automatically explore the state space in a formal manner.

While existing assertion-based verification techniques partially automate the verification process, they do so by modifying the hardware description to include assertions, which may cause design changes and/or pollution. Furthermore, while an assertion violation proves that the design is not correct, proving design correctness is intractable, and there is no way to determine a "reasonable" testing timeframe that will flush out most of the design bugs. An additional limitation is that current coverage techniques are implemented using simulation techniques that do not leverage the formal verification techniques typically employed for model checking.

Hence, what is needed is a method and an apparatus for verifying a design that achieves high levels of structural coverage of the design without the above-described problems.

SUMMARY

One embodiment of the present invention provides a method and a system that facilitates structural coverage of a design during a design verification process. During operation, the system receives a hardware description of the design, which contains one or more module instances and a set of structural coverage targets for a set of structures in the design. The system then extracts a control flow, the set of structural coverage targets, and a set of structural coverage metrics for the hardware description, and creates a shadow module with the same, control flow as the hardware description. This shadow module contains a set of parallel structures that correspond to the set of structural coverage targets in the control flow of the hardware description and serve as targets for formal methods used to analyze the design. The system also generates a set of cross-module references to link the set of parallel structures in the shadow module with signals from the set of structures in the hardware description. The system then applies a formal verification tool to the design, the shadow module, and the cross-module references in an attempt to achieve the desired structural coverage.

In a variation on this embodiment, the formal verification tool includes a formal-model checker. This formal-model checker can use techniques that include but are not limited to Boolean satisfiability (SAT), automatic test pattern generation (ATPG), and symbolic methods such as binary decision diagrams (BDDs).

In a variation on this embodiment, the types of coverage provided by the set of structural coverage targets include, but are not limited to, line and statement coverage, condition coverage, toggle coverage, finite-state machine (FSM) coverage, path coverage, and/or branch coverage.

In a variation on this embodiment, creating the shadow module and the set of parallel structures involves extracting the control flow and the set of structural coverage targets from the design and from a user specification of coverage targets.

In a further variation, the shadow module and the set of parallel structures enable the formal verification tool to build a formal model and a simulation model for the design. The formal verification tool uses the formal model and the simulation model to manipulate the set of inputs to the hardware description to exercise the code areas specified by the set of structural coverage targets.

In a further variation, the system generates hardware-description language specifications that are synthesizable, simulateable, and instrumented to represent structural coverage targets as pseudo-properties or "targets" for formal analysis.

In a further variation, while generating the set of parallel structures within the shadow module, the system ensures that these parallel structures are language-correct. In doing so, the system replicates the control flow in the shadow module and the set of parallel structures to facilitate verification while preventing the hardware description from becoming changed and/or polluted.

In a further variation, the method transforms the code-coverage problem into a form that can be handled by a formal-model checker.

BRIEF DESCRIPTION OF THE FIGURES

FIG. 3A illustrates a code block in a design-under-test in accordance with an embodiment of the present invention.

FIG. 3B illustrates a code block in a design-under-test with two coverage targets inserted into it in accordance with an embodiment of the present invention.

FIG. 3C illustrates a code block in a design-under-test with condition coverage targets for an assignment statement in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs).

Design Simulation and Assertion-Based Verification

Figure 1:
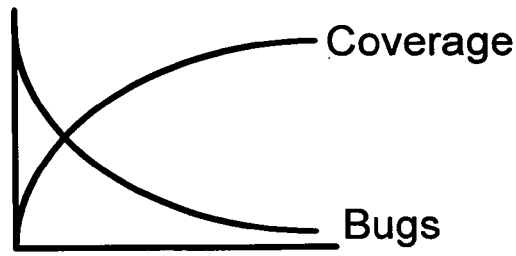
FIG. 1 illustrates how the number of remaining bugs in a design descreases as the simulation, testing, and verification process covers a progressively larger portion of the design in accordance with an embodiment of the present invention.

Design verification attempts to determine whether a design-under-test (DUT) will operate as expected. During the verification process, the DUT is simulated and tested in an attempt to ensure correctness. However, due to the complexity and size of modern designs, covering every design state and executing every line of code across a wide range of conditions is intractable. Note that creating tests that cover even 50% of the state space is typically difficult and expensive, and continues to grow more so. Often, the goal of verification is to determine and test a "reasonable" subset of the design to ensure that the observable behavior is as expected. As is illustrated in FIG. 1, when the simulation, testing, and structural verification process covers a larger portion of the design (i.e., it has more "coverage"), a larger percentage of the remaining design bugs are likely to be found. Therefore, one of the challenges of design verification is ensuring better coverage of the design during the structural verification process so that more bugs are found during the design process.

Assertion-based verification operates by sprinkling monitoring points throughout the design description in the hope of detecting violations during design simulation. In doing so, assertions are added to the description during simulation, but not to the final hardware, to describe conditions that should not occur during normal operation. The system then exercises the design using testing methods, for instance random simulation, in the hope that any bugs present in the design will trigger the assertions.

An example of an assertion is a test to ensure that a hardware description can never index past the end of a FIFO (first-in, first-out) queue. This test is added into the hardware description, and is triggered during simulation if an index is used to reference beyond the end of the queue. If the assertion triggers, the designer knows there is a bug in the design. However, if the queue never fills up during simulation and the assertion thus does not trigger during the testing period (e.g. a month), there is no certainty that the design is bug-free. While high coverage and no triggered assertions may indicate that the design is "probably OK", there are no guarantees. Although verification tools are able to prove some assertions completely, such proofs are computationally expensive and thus intractable for many designs.

Figure 2:
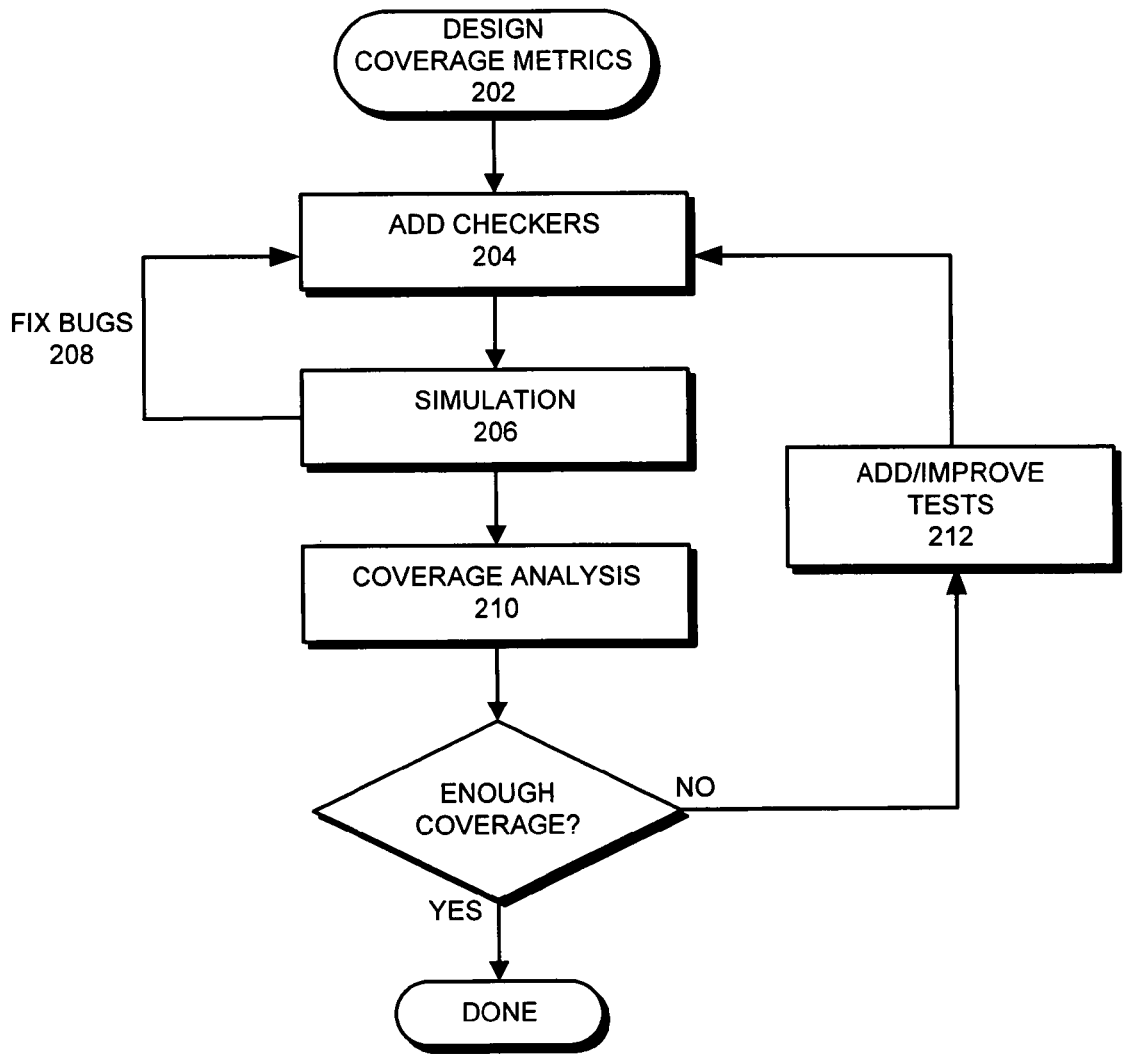
FIG. 2 presents a flow chart illustrating a typical simulation and debug cycle for a design in accordance with an embodiment of the present invention.

FIG. 2 presents a flow chart illustrating a typical simulation and debug cycle for a design. During this process, a user creates a design and a set of design coverage metrics 202. The system and/or a user adds checkers 204 (assertions) to the hardware description, and the design is then simulated 206. If an assertion is violated, the corresponding bug is fixed 208, and the simulation is re-run, perhaps with additional checkers inserted. After a successful simulation run, coverage is analyzed 210 to determine the portion of the design covered by the simulation. If the coverage is sufficient, the cycle is complete. Otherwise, the user improves or supplements the tests (step 212), and the cycle is repeated. The present invention attempts to minimize the number of loops required in this process, and thereby reduce the human cost, by using formal verification technologies to automate test creation and thereby cover more of the design.

Structural Coverage

While the previous section loosely describes coverage as the portion of the design covered during testing, determining structural coverage for a hardware description typically uses different types of coverage metrics including but not limited to:

Line/statement coverage: Line coverage corresponds to the number of lines of hardware description language (HDL) code exercised in the simulation of the hardware description. For instance, executing 98% of the lines of code in the description results in 98% line coverage. Note that this type of coverage does not analyze the intent of the instructions, only whether they have been reached.

Condition coverage: Condition coverage looks at statements to determine all of the ways in which they might be true and false.

For instance, for a logic statement such as (A&B&! C), condition coverage might cover all eight combinations of values for A, B, and C.

Toggle coverage: Toggle coverage measures whether a wire in a design has gone to both zero and one during the simulation process.

FSM coverage: FSM coverage determines whether the simulation exercises all the combinations of a finite state machine in the design.

Path coverage: Path coverage determines whether the simulation traverses a specified series of paths through a finite state machine in the design.

Branch coverage: Branch coverage determines whether boolean expressions tested in control structures (e.g. an if-else statement) evaluate to both true and false. Unlike condition coverage, branch coverage does not test all of the possible values, but instead only ensures that all possible branches execute during simulation.

Note that structural coverage metrics are positive goals that the simulation seeks to achieve, as opposed to assertion violations, which are undesirable events.

The simulator generates a flood of data during simulation, as it attempts to cover the specified coverage metrics. A coverage tool helps the user to manage and filter this data. As part of the simulation process, the coverage tool also attempts to find and cover any remaining areas not yet covered.

Using Model Checkers to Ensure Structural Coverage

Model checkers are formal verification tools which are used to generate full proofs of properties and assertions, for instance by using techniques such as boolean satisfiability (SAT), automatic test pattern generation (ATPG), and binary decision diagrams (BDDs). Although model checkers have become more practical in recent years, there has been no way to adapt them to providing structural coverage. The present invention describes a technique that allows model checkers to be applied to structural coverage.

Typically, model checkers are focused on individual problems, e.g. a single property proof. In this situation, uncompleted runs do not offer any useful intermediate data or indications as to whether the run would be successful or not. However, if a model checker runs on a larger set of assertions for a time interval, the result is typically a useful set of partial results. For instance, if the model checker attempts to prove ten properties, it might be able to say nothing about three of the properties, but still be able to generate conclusive results for seven properties. The problem of providing structural coverage can be re-structured as many (e.g. tens of thousands or millions) small structural coverage problems for which partial results would be beneficial.

Structural coverage problems can be re-structured by creating a set of coverage variables that a model checker can manipulate. FIG. 3A illustrates a code block in a DUT 302 that contains a condition statement. FIG. 3B illustrates the same code block with two coverage targets, target T1 304 and target T2 306, inserted. In terms of the hardware description, these insertions essentially add the coverage targets as new wires in the design. The tool initializes these targets with the value zero, and then the formal engine attempts to exercise the corresponding portion of the code block that assigns the value one to the targets. Essentially, if by the end of the simulation the tool manages to assign the value one to both inserted signals T1 and T2, the tool guarantees coverage of both branches and code segments in the original code.

FIG. 3C illustrates the same DUT block 302 with condition coverage targets for an assignment statement. The systems adds wires for all of the possible conditions of the assignment, which for this example results in a set of four wires that correspond to the four condition coverage targets 308.

While the process of inserting wires to represent coverage targets can be performed using a program that parses through the code and inserts the coverage annotations directly into the hardware description, this is undesirable for practical reasons. For instance, the annotations may increase the size of the code while also reducing code readability. Reducing code readability in turn affects the efficiency of the debugging process; while the annotations may help to identify bugs, analyzing the difficult-to-read annotated code to determine the root problem can be challenging and time-consuming. This technique can also result in design changes and/or pollution. Depending on the programming language used for the annotation program, this process may also be too complicated for the language and result in uncompilable code and syntax errors. A better solution adds and simulates the set of coverage targets without modifying the original hardware description.

Shadow Modules

One embodiment of the present invention facilitates the structural verification of designs by building parallel "shadow modules" that allow coverage targets to be included in the simulation process without modifying the hardware description. A verification tool builds a "shadow world" that has the same control flow as the original hardware description and then represents coverage targets as wires as described in the previous section. Since this shadow world is closely-coupled to the initial hardware description, shadow modules include only the control flow of the original design and typically do not duplicate computation.

Figure 4:
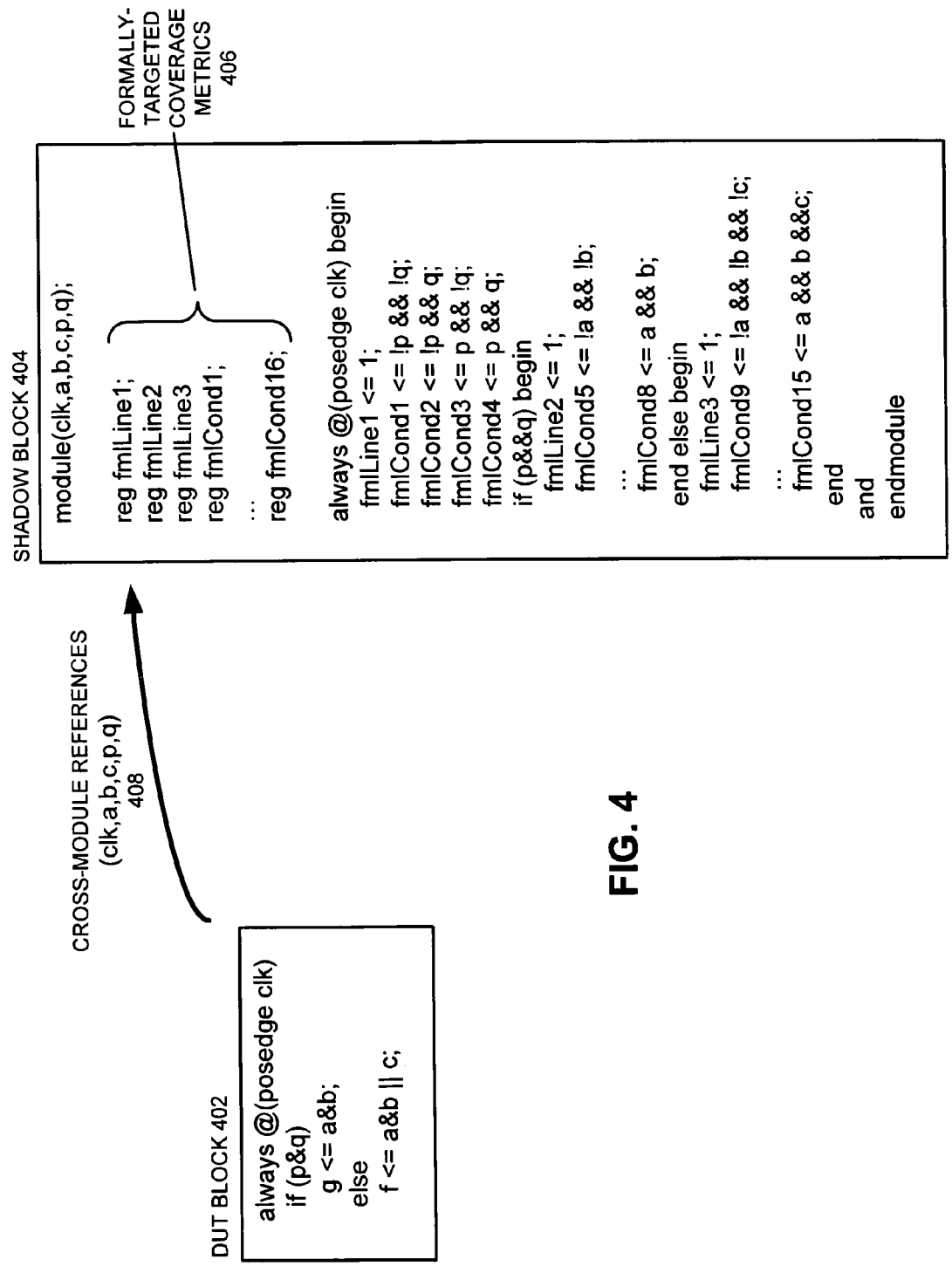
FIG. 4 illustrates a design-under-test block and a corresponding shadow block in accordance with an embodiment of the present invention.

FIG. 4 illustrates a DUT block 402 and a corresponding shadow block 404. The shadow block 404 includes the declaration of formally-targeted coverage metrics 406 and a control flow substantially similar to that of the DUT block 402. If, for example, a particular branch is taken in the shadow block, the system can guarantee that the corresponding branch is also taken in the DUT, thereby guaranteeing coverage. The system uses HDL language constructs and simulator mechanisms to connect shadow inputs to the DUT signals (e.g. cross-module references 408 in the Verilog HDL).

Figure 5:
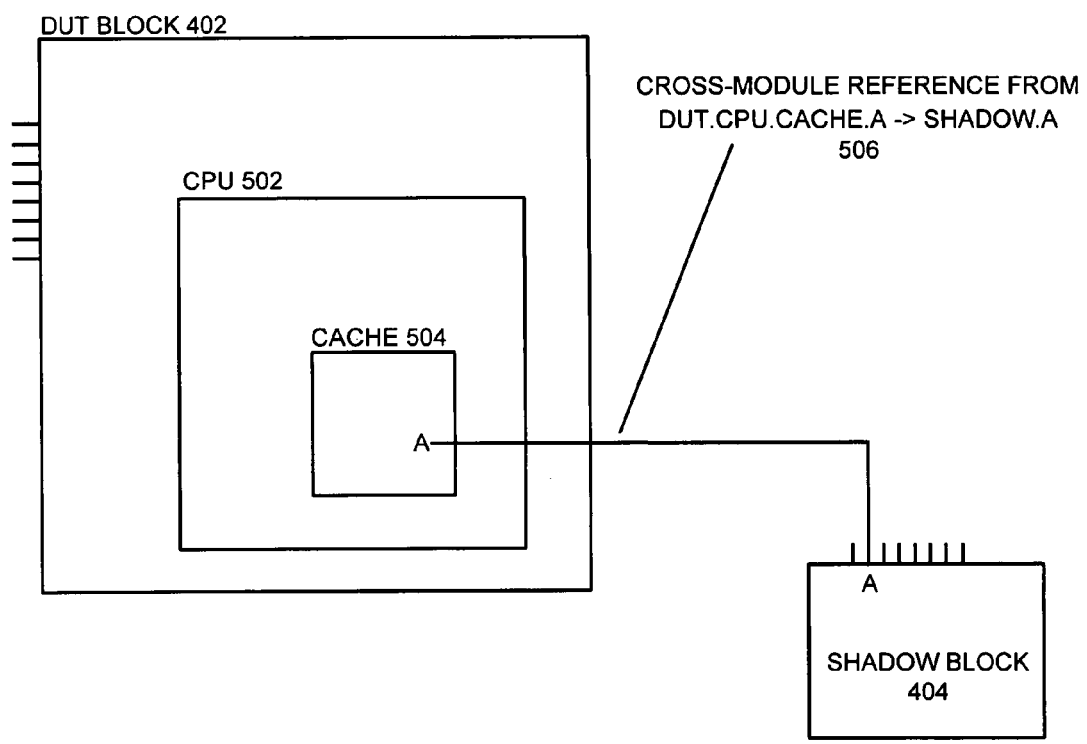
FIG. 5 illustrates a cross-module reference in accordance with an embodiment of the present invention.

FIG. 5 illustrates a cross-module reference for the DUT block 402. DUTs are hierarchical in nature, and in this case, the DUT shown includes a central processing unit (CPU) 502, which in turn includes a cache 504. A signal "A" in the cache 504 is exported to the shadow block 404 using a cross-module reference from "DUT.CPU.CACHE.A" to "SHADOW.A" 506. Note that some HDL languages use different mechanisms for such cross-module references.

Figure 6:
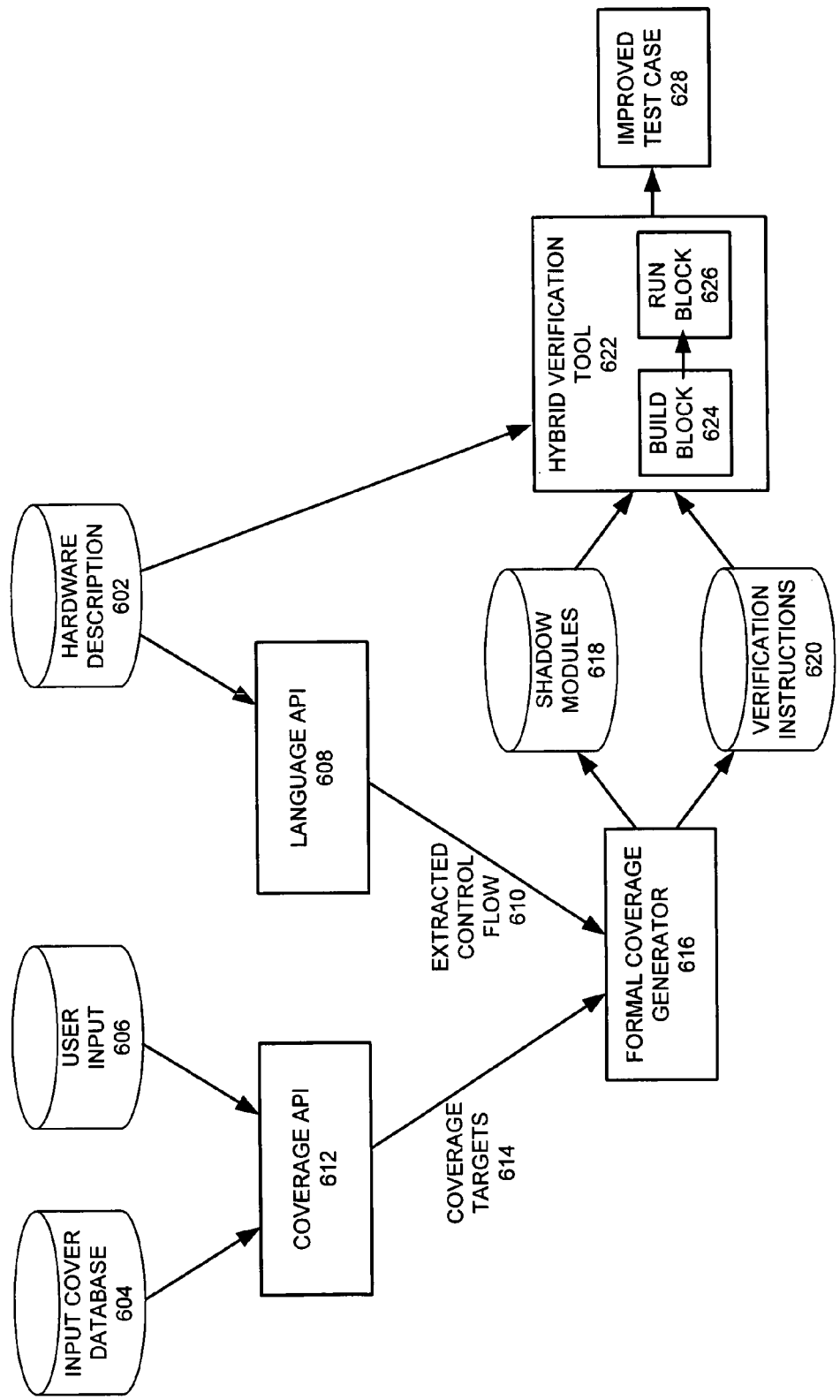
FIG. 6 illustrates the flow of operations for structural verification using shadow modules in accordance with an embodiment of the present invention.
Figure 7:
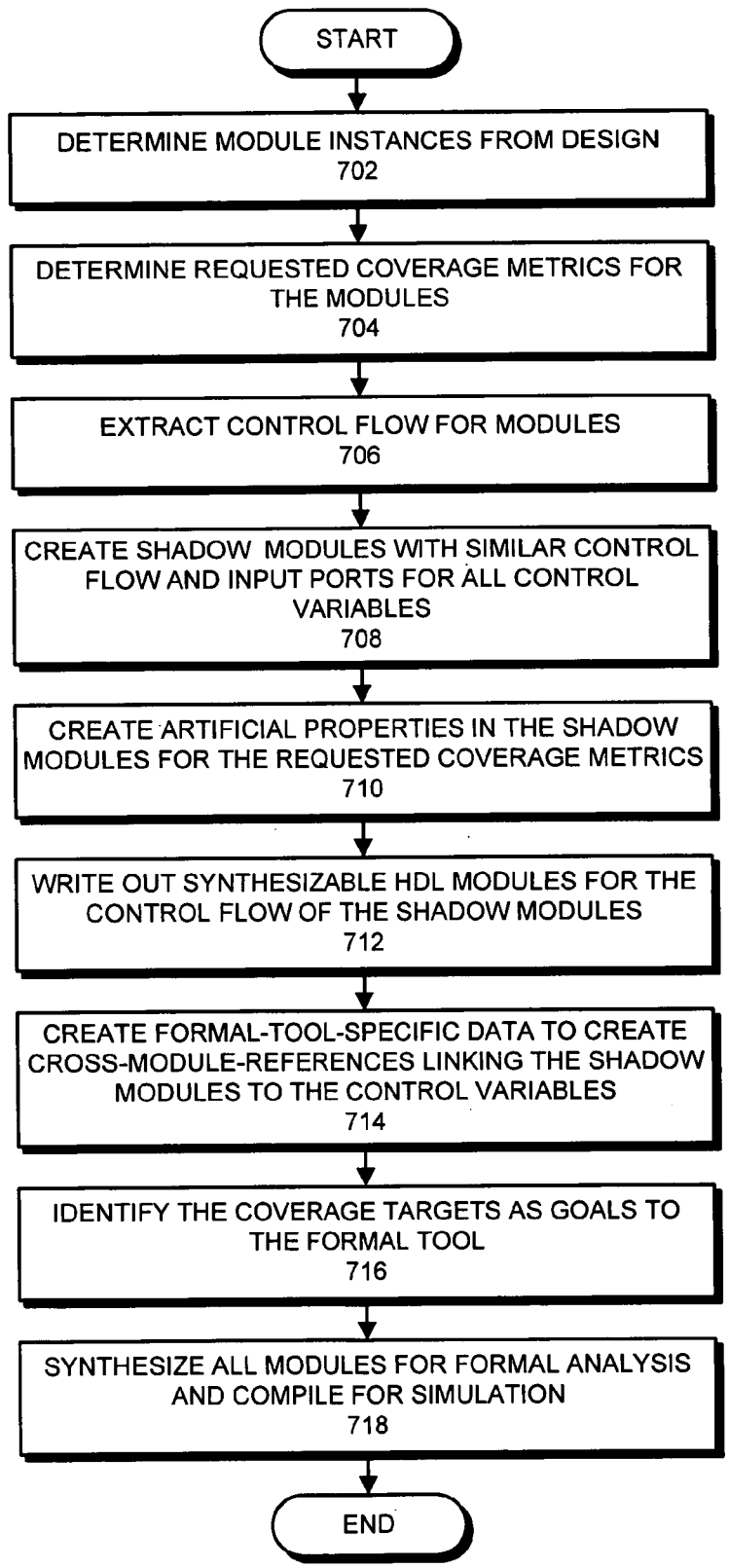
FIG. 7 presents a flow chart illustrating the generation and integration of a shadow module in accordance with an embodiment of the present invention.

FIG. 6 illustrates the flow of operations for structural verification using shadow modules. FIG. 7 presents a flow chart illustrating the generation and integration of a shadow module. First, the system determines the module instances from the design (step 702) by analyzing the hardware description 602 using a language API 608. Then, the system determines the requested coverage metrics for the modules (step 704) by analyzing both an input cover database 604 and coverage targets specified in user input 606 using a coverage API 612. The language API 608 provides information that allows the system to probe the design, build a control graph, and then create an extracted control flow 610 (step 706). The coverage API 612 helps to output a set of coverage targets 614. Note that the APIs that extract coverage targets and control flow are general and may include, but are not limited to, public industry-standard APIs, company-proprietary APIs, and custom solutions built, for instance, using lexical analyzers and parser generators.

A formal coverage generator 616 uses the coverage targets 614 and extracted control flow 610 to generate the shadow modules 618 (step 708). The shadow modules 618 shadow the control flow of the design, and include input ports for all of the control variables in the corresponding module in the DUT. The system also creates artificial properties in the shadow modules for the requested coverage metrics (step 710). The formal coverage generator writes out the shadow modules as synthesizable HDL modules (step 712). The formal coverage generator 616 also outputs a set of verification instructions 620. This formal-tool-specific data defines cross-module references that link the shadow modules to the control variables in the hardware description and identify coverage goals in the shadow blocks (step 714).

The system presents the shadow modules 618 and verification instructions 620, along with the original hardware description 602, to a hybrid verification tool 622 that includes a build block 624 and a run block 626. The build block 624 identifies the coverage targets as goals (step 716), and then synthesizes all of the modules for formal analysis and compiles the set of modules for simulation (step 718).

The flow in FIG. 7 generates everything the formal engine needs to target the coverage targets, including how to represent the targets and what the tool will need to do to link in the parallel shadow modules. The hybrid verification tool 622 uses a formal model and a simulation model for the design to enable collaborative simulation and formal analysis, and thereby produce the improved high-coverage test case 628.

Now that the coverage targets are represented as wires, the run block 626 analyzes and collaboratively simulates the resulting modules, using a model checker to work towards achieving structural coverage. The model checker determines how the primary inputs of the design can be manipulated such that the wires (goals) representing the desired coverage targets are triggered, thereby ensuring that the corresponding code in the non-shadow modules has been covered. The tool then passes these input patterns to the simulation engine, which proceeds to simulate the design and shadow modules and thus achieve the coverage targets. When the coverage is sufficient (see FIG. 2), the design verification process is done.

In summary, the present invention improves structural verification by transforming the structural coverage problem into a form that allows a model-checker to be applied to structural coverage. After a user completes the design and specifies coverage targets, the system converts the description into the inputs for the formal engine, which can then use known techniques to find input combinations for the DUT that exercise the desired coverage targets. The result is improved structural coverage that reduces the (expensive) user time required, and a better-tested design that is more likely to be correct.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for facilitating structural coverage of a design during a design verification process, comprising:
   receiving a hardware description of the design, wherein the hardware description of the design contains one or more module instances and a set of structural coverage targets for a set of structures in the design;
   extracting a control flow, the set of structural coverage targets, and a set of structural coverage metrics for the hardware description;
   creating a shadow module which has the same control flow as the design and which contains a set of parallel structures that correspond to the set of structural coverage targets in the control flow of the hardware description;
   generating a set of cross-module references that link the set of parallel structures with signals from the set of structures; and
   applying a formal verification tool to the design, the shadow module, and the set of cross-module references to achieve a desired structural coverage;
   building a formal model and a simulation model for the design; and
   manipulating a set of inputs to the hardware description of the design to exercise code areas specified by a set of structural coverage tests.

2. The method of claim 1,
   wherein the formal verification tool includes a formal-model checker; and
   wherein the formal-model checker can use techniques that include but are not limited to:
      Boolean satisfiability (SAT),
      automatic test pattern generation (ATPG), and
      symbolic methods including binary decision diagrams (BDDs).

3. The method of claim 2, wherein the method is used to generate hardware-description language specifications that are synthesizable, simulateable, and instrumented to represent structural coverage targets as pseudo-properties or "targets" for formal analysis.

4. The method of claim 3,
   wherein the set of parallel structures contained by the shadow module are language-correct; and
   wherein replicating the control flow in the shadow module and the set of parallel structures facilitates verification while preventing the hardware description from becoming changed and/or polluted.

5. The method of claim 4, wherein the method transforms a code-coverage problem into a form that can be handled by the formal-model checker.

6. The method of claim 1, wherein a coverage provided by the set of structural coverage targets includes:
   line and statement coverage;
   condition coverage;
   toggle coverage;
   finite-state machine (FSM) coverage;
   path coverage; and/or
   branch coverage.

7. The method of claim 1, wherein creating the shadow module and the set of parallel structures involves extracting the control flow and the set of structural coverage targets from the design and from a user specification of coverage targets.

8. A computer-readable storage medium storing instructions that when executed by a computer cause the computer to perform a method for facilitating structural coverage of a design during a design verification process, the method comprising:
   receiving a hardware description of the design, wherein the hardware description of the design contains one or more module instances and a set of structural coverage targets for a set of structures in the design;
   extracting a control flow, the set of structural coverage targets, and a set of structural coverage metrics for the hardware description;
   creating a shadow module which has the same control flow as the design and which contains a set of parallel structures that correspond to the set of structural coverage targets in the control flow of the hardware description;
   generating a set of cross-module references that link the set of parallel structures with signals from the set of structures;
   applying a formal verification tool to the design, the shadow module, and the set of cross-module references to achieve a desired structural coverage;
   building a formal model and a simulation model for the design; and
   manipulating a set of inputs to the hardware description of the design to exercise code areas specified by a set of structural coverage tests.

9. The computer-readable storage medium of claim 8, wherein the formal verification tool includes a formal-model checker; and wherein the formal-model checker can use techniques that include but are not limited to:
Boolean satisfiability (SAT),
automatic test pattern generation (ATPG), and
symbolic methods including binary decision diagrams (BDDs).

10. The computer-readable storage medium of claim 9, wherein the method is used to generate hardware-description language specifications that are synthesizable, simulateable, and instrumented to represent structural coverage targets as pseudo-properties or "targets" for formal analysis.

11. The computer-readable storage medium of claim 10, wherein the set of parallel structures contained by the shadow module are language-correct; and
wherein replicating the control flow in the shadow module and the set of parallel structures facilitates verification while preventing the hardware description from becoming changed and/or polluted.

12. The computer-readable storage medium of claim 11, wherein the method transforms a code-coverage problem into a form that can be handled by the formal-model checker.

13. The computer-readable storage medium of claim 8, wherein a coverage provided by the set of structural coverage targets includes:
line and statement coverage;
condition coverage;
toggle coverage;
finite-state machine (FSM) coverage;
path coverage; and/or
branch coverage.

14. The computer-readable storage medium of claim 8, wherein creating the shadow module and the set of parallel structures involves extracting the control flow and the set of structural coverage targets from the design and from a user specification of coverage targets.

15. An apparatus for facilitating structural coverage of a design during a design verification process, comprising:
a receiving mechanism configured to receive a hardware description of the design, wherein the hardware description of the design contains one or more module instances and a set of structural coverage targets for a set of structures in the design;
an extraction mechanism configured to extract a control flow, the set of structural coverage targets, and a set of structural coverage metrics for the hardware description;
a creation mechanism configured to create a shadow module which has the same control flow as the design and which contains a set of parallel structures that correspond to the set of structural coverage targets in the control flow of the hardware description;
a generation mechanism configured to generate a set of cross-module references that link the set of parallel structures with signals from the set of structures;
an application mechanism configured to apply a formal verification tool to the design, the shadow module, and the set of cross-module references to achieve a desired structural coverage;
a model build mechanism configured to enable the formal verification tool to build a formal model and a simulation model for the design; and
a code exercise mechanism configured to manipulate a set of inputs to the hardware description of the design specified by a set of structural coverage tests.

16. The apparatus of claim 15, wherein the formal verification tool includes a formal-model checker; and
wherein the formal-model checker can use techniques that include but are not limited to:
Boolean satisfiability (SAT),
automatic test pattern generation (ATPG), and
symbolic methods including binary decision diagrams (BDDs).

17. The apparatus of claim 15, wherein a coverage provided by the set of structural coverage targets includes:
line and statement coverage;
condition coverage;
toggle coverage;
finite-state machine (FSM) coverage;
path coverage; and/or
branch coverage.

18. The apparatus of claim 15, wherein creating the shadow module and the set of parallel structures involves extracting the control flow and the set of structural coverage targets from the design and from a user specification of coverage targets.

* * * * *